United States Patent [19]
Capps, Jr. et al.

[11] Patent Number: 5,961,660
[45] Date of Patent: Oct. 5, 1999

[54] METHOD AND APPARATUS FOR OPTIMIZING ECC MEMORY PERFORMANCE

[75] Inventors: Louis Bennie Capps, Jr., Round Rock; Thoi Nguyen, Austin, both of Tex.

[73] Assignee: International Business Machines Corporation, Armonk, N.Y.

[21] Appl. No.: 08/808,771

[22] Filed: Mar. 3, 1997

[51] Int. Cl.[6] .......................... G06F 11/10; H03M 13/12
[52] U.S. Cl. ........................ 714/763; 714/800; 714/752
[58] Field of Search ................... 371/40.11, 49.1, 371/37.01; 395/185.05; 714/763, 800, 752, 52

[56] References Cited

U.S. PATENT DOCUMENTS 5,313,475  5/1994  Cromer et al. ................... 371/40.1
5,488,691  1/1996  Fuoco et al. ..................... 395/185.05

*Primary Examiner*—Phung M. Chung
*Attorney, Agent, or Firm*—David A. Mims, Jr.

[57] ABSTRACT

A method and apparatus for providing a memory system having error checking and correction (ECC) capability, and parity error detection capability on the same memory card, and user selection of either capability using the same type of memory modules. A memory controller having programmable configuration registers is provide for user selection of either ECC or parity capability. Eight-byte Dual in-line Memory Modules are used to provide 64-bit data which allows the memory controller to use eight extra bits for both ECC and parity capability.

10 Claims, 10 Drawing Sheets

METHOD AND APPARATUS FOR OPTIMIZING ECC MEMORY PERFORMANCE

FIELD OF THE INVENTION

The present invention relates to data processing systems, and more particularly, to a memory controller capable of providing memory integrity and performance by supporting both parity and ECC memory operations using the same memory modules.

BACKGROUND OF THE INVENTION

Technological advances in computer components are providing continually refined microprocessors, memories and support chips for modern personal computer systems. The inevitable evolution of the memory systems coupled to these computer systems have allowed system designers flexibility to tune them for maximum performance at a reasonable cost. This evolution is evident in the memory types currently available for personal computers. Non-parity memory, which offers no error checking when data is read from memory, has historically been installed in lower cost computer systems. Parity memory, which provides the ability to check data read from memory against parity bits to determine if any data stored in memory is incorrect, has been reserved for commercial customers requiring data integrity and high performance. The computer systems of commercial customers have also been the prevalent users of memories having error checking and correcting capability (ECC) which allows the detection and correction of certain memory errors. Memory systems with ECC capability have typically had a higher cost and lower performance then comparable parity systems. The evolution in computer memories have resulted in closure of the gap between the cost of memories having parity and ECC, and system designers are now faced with providing the appropriate memory choice for its users.

One prior art technique provides either parity or ECC capability in a large scale integration (LSI) chip. The LSI chip provides error detection and correction circuits which operates in a modified Hamming code, so that each error detection and correction circuit may generate either ECC parity bits for single error correction and double error detection, or generate byte parity bits for byte error detection. The chosen code permits the generation of syndrome bits for correcting single bit errors, with the same group of syndrome bits delivered to each of plural data "sliced" data chips when correcting the bit in error, so that each of the data chips may be constructed identically. While the technique delivers either capability, the implementation requires complex LSI components which must be customized to a particular implementation. In addition, the technique provides no ability to allow the user to easily switch between parity or non-parity capability to increase the performance of a computer system.

Another prior art technique discloses a personal computer having enhanced memory access capabilities where ECC and parity error checking can be selectively chosen for memory elements installed in the computer system. The technique discloses non-adjacent placement of the necessary bits for error detection from the data bits. Dynamic random access memory (DRAM) cards are arranged in sockets. The presence or absence of DRAM cards in particular sockets allows a user to switch between ECC and parity operation. The technique provides a low cost method of using the same memory cards in a computer system to select either ECC or parity operation. The technique suffer from a requirement of arranging the cards in the particular sockets to obtain the preferred operation. In addition, certain sockets must be left empty within the computer system resulting in loss of space or increased computer size.

Consequently, it would be desirable to provide a technique for providing either parity or ECC memory that is easily selectable by a user in a computer system.

SUMMARY OF THE INVENTION

This invention relates to a method and apparatus for providing a memory system having error checking and correction (ECC) capability and parity error detection capability on the same memory card, and user selection of either capability using the same type of memory modules. A memory controller having programmable configuration registers is provided for user selection of either ECC or parity capability. The user selection is saved in a non-volatile memory. Eight-byte Dual in-line Memory Modules are used to provide 64-bit data which allows the memory controller to use eight extra bits for both ECC and parity capability for the memory system.

DETAILED DESCRIPTION OF THE EMBODIMENTS

This invention provides a method and apparatus for allowing ECC memory to be used in parity or ECC mode, and provides a user with the flexibility of either with the same type of memory modules. This capability is provided through a memory controller which uses eight-byte memory modules. Eight-byte dual inline memory modules (DIMMs) permit an eight-byte format ECC and parity that requires the same number of extra bits per byte. The invention will be explained in further detail with reference to FIGS. 1–8.

Figure 1:
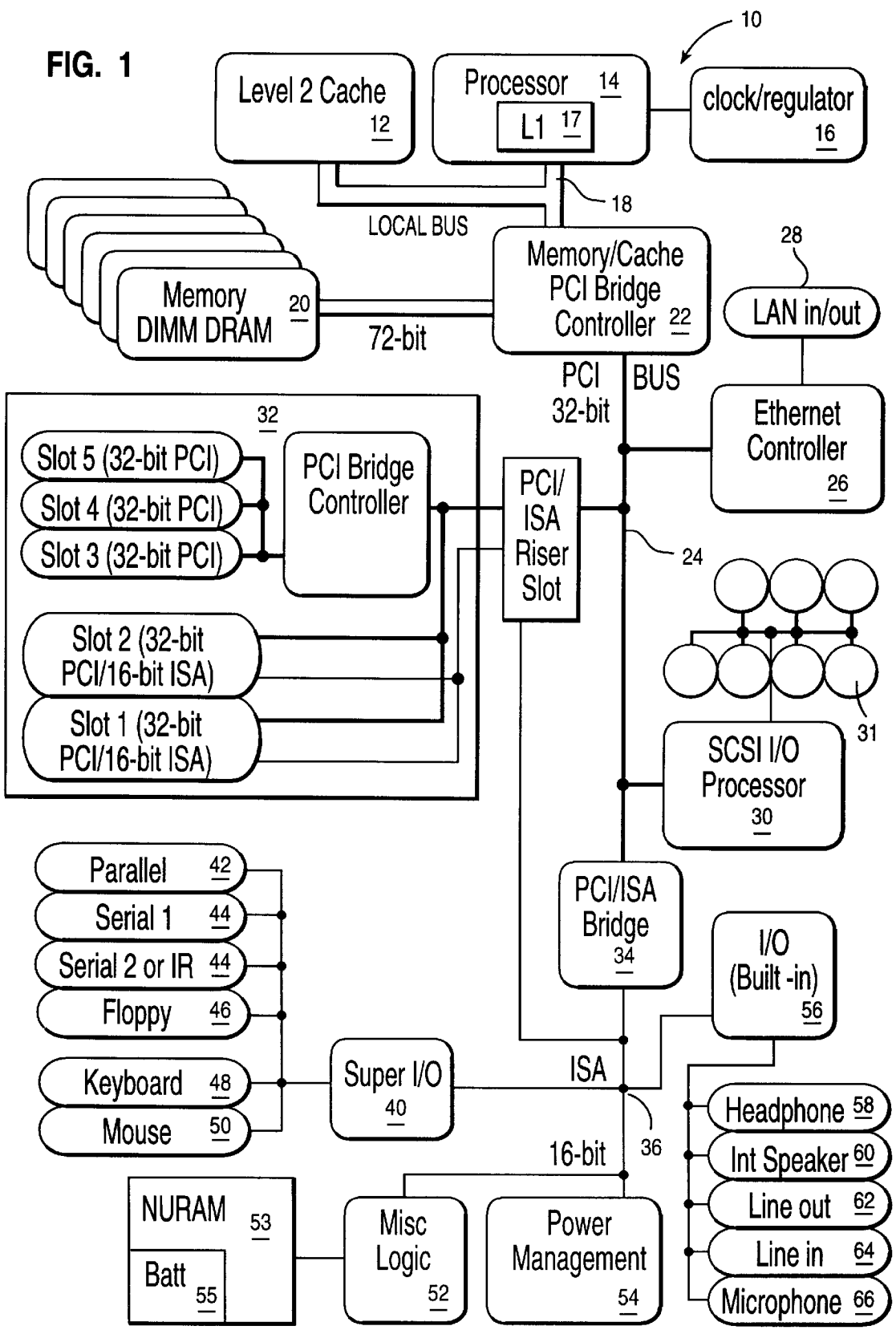
FIG. 1 is an illustrative embodiment of a computer system where the present invention may be practiced.

Referring now to FIG. 1, there is shown a pictorial representation of a computer system 10 where the invention may be practiced. The computer system 10 includes a processor 14 which contains an internal level-1 (L1) cache 17. Processor 14 may be any member of the PowerPC 60X microprocessor family manufactured by the IBM Corporation, or any compatible microprocessor. A clock/regulator 16 provides clock timing/voltage core signals for the processor 14. A local processor bus 18 exits processor 14 and interfaces with a L2 memory cache 12 module and a Memory/Cache Peripheral Component Interconnect (PCI) Bridge Controller 22. The Memory/Cache PCI Bridge Controller 22, containing the memory controller of this invention, provides memory control signals to memory dual inline memory modules DRAMs 20, and converts the high speed processor bus 18 to one appropriate for use as a medium speed PCI bus 24. The PCI bus 24 allows communication over a local area network (LAN) 28 via an adapter such as an Ethernet controller 26. Small Computer Systems Interface (SCSI) devices 31 may also be attached to the PCI bus 24 via SCSI I/O processor 30. Slots 32 are provided for attaching devices that communicate with Processor 14 through PCI bus 24. A PCI/Industry Standard Architecture (ISA) bridge 34 converts the medium speed PCI bus 24 to an ISA bus 36. The ISA bus 36 allows attachment of power management 54 controls as well as any miscellaneous logic 52 required to communicate with the Processor 14. The miscellaneous logic 52 provides control for NVRAM 53 (non-volatile RAM) to allow the processor 14 to read and write setup information for configuration of the computer system during initial program load (IPL). The setup information contains a bit that maintains a user configured value for ECC or parity mode. The NVRAM 53 contains memory and uses a battery 55 during the time when the system is powered off to maintain its internal state. Any number of I/O devices may be attached through parallel 42 and serial 44 ports through super I/O port 40. This includes a floppy 46 disk, keyboard 48, and mouse 50. A second adapter provides for built-in I/Os 56 such as a headphone 58, internal speaker 60, microphone 66, line in 64 and line out 62 provisions.

Figure 2:
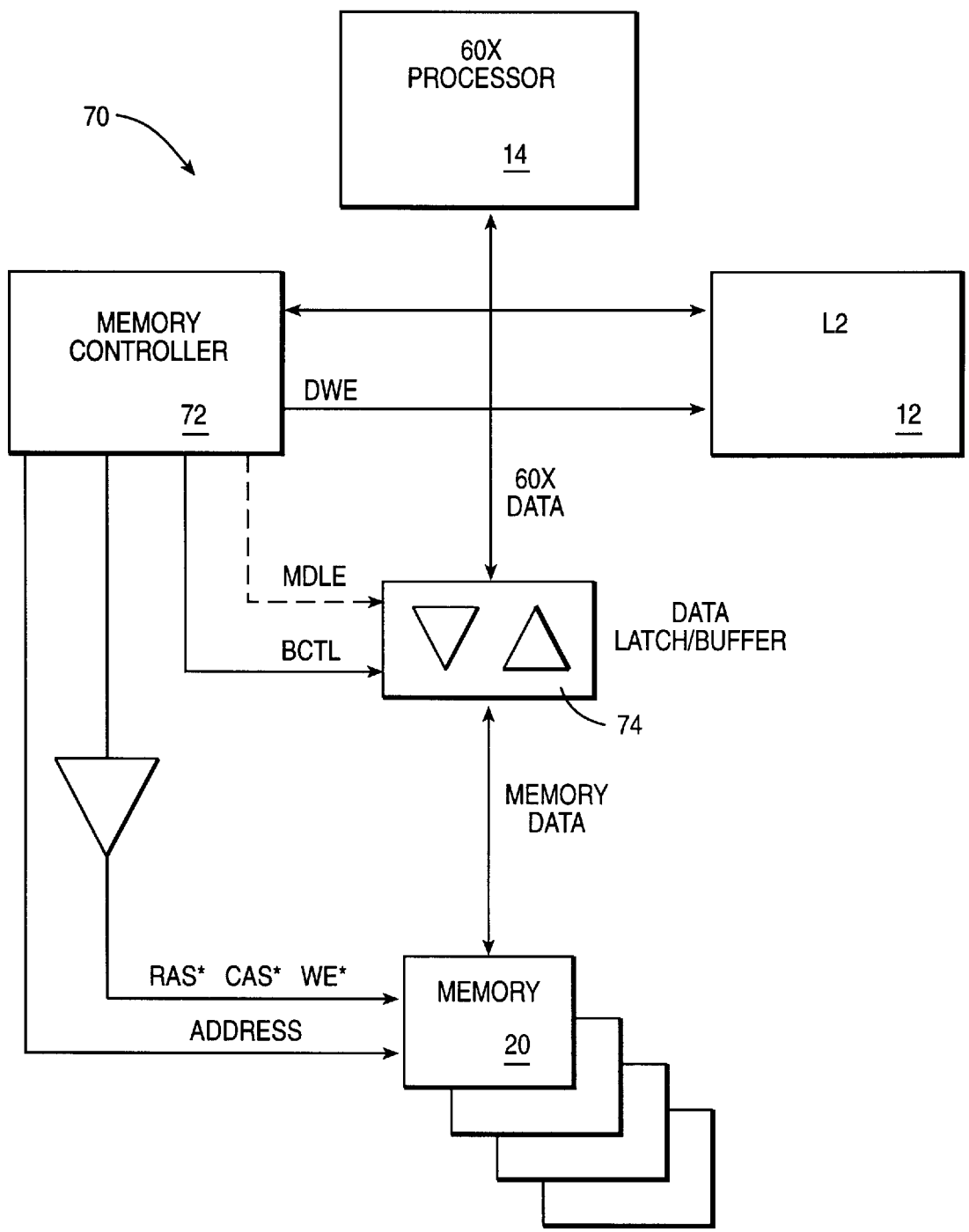
FIG. 2 is a pictorial of the memory controller used to provide both ECC and parity operations using the invention.

Referring now to FIG. 2, there is shown a pictorial of a memory system configuration 70 containing the memory controller of the invention. Memory controller 72 provides the necessary control signals (RAS*(n); CAS*(n); WE*(n); Address) for the dynamic memory modules 20. In addition, the memory controller 72 provides the necessary control signals for the L2 (12) static ram. Finally, the memory controller controls the data latch/buffer 74 to allow the processor 14 to read and write the DIMM dynamic ram memory 20.

Figure 3A:
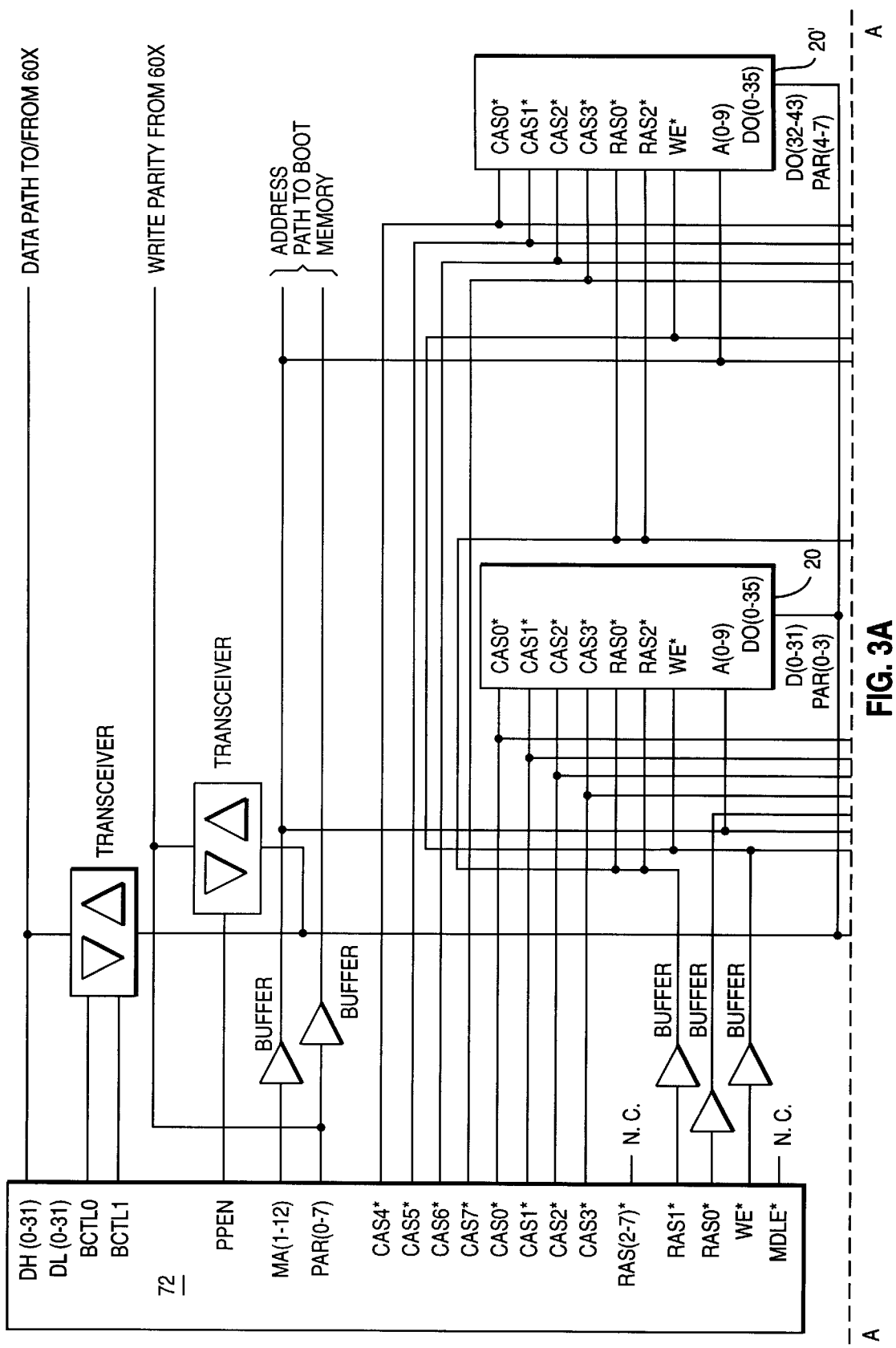
FIG. 3 illustrates the memory controller connected to a plurality of memory banks.
Figure 3B:
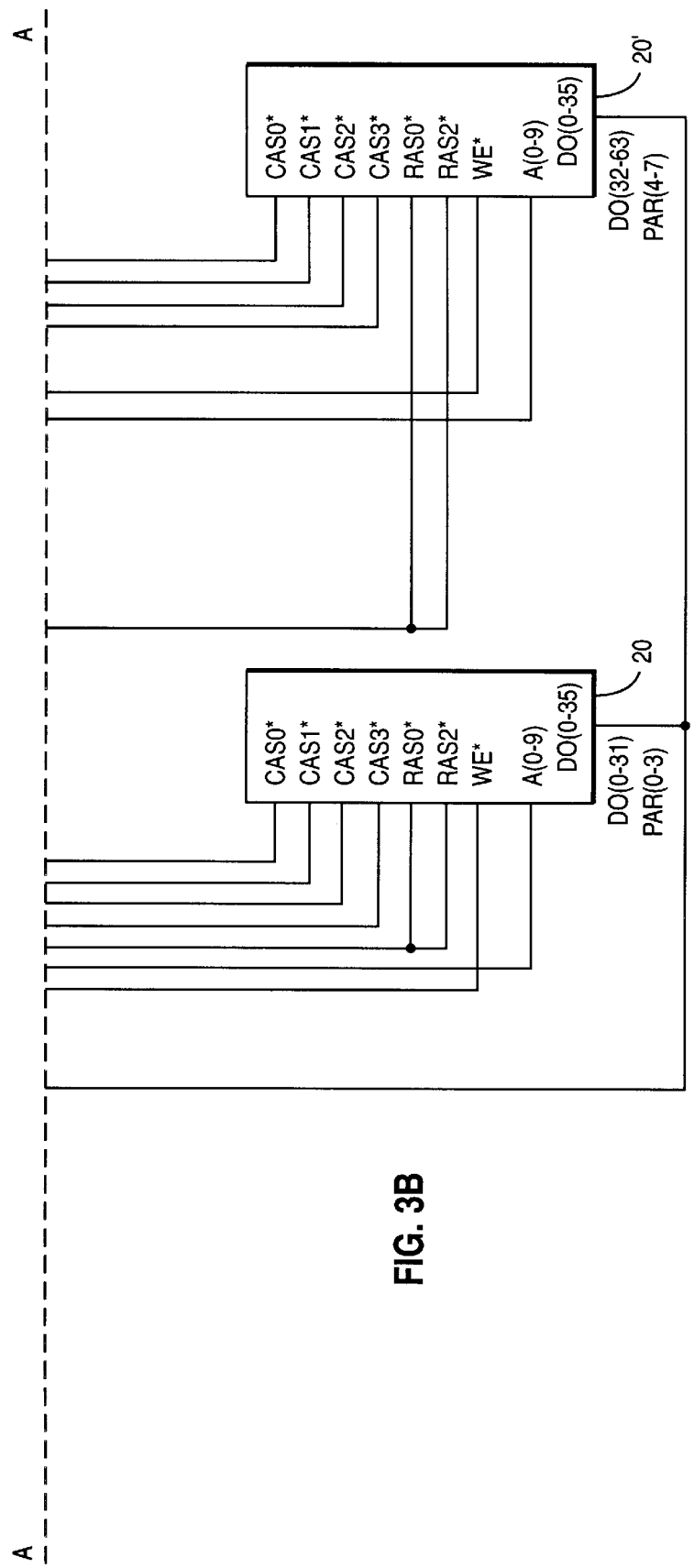

Referring now to FIG. 3, there is shown a two-bank 16-Mbyte DRAM system configured for ECC and parity operation using the same memory modules and connections. Memory controller 72 handles parity checking and generation for all memory reads and PCI writes to memory, with eight parity bits checked or generated for a 64-bit data path when used in parity mode. When the memory controller 72 is used in ECC mode, the memory controller 72 detects and corrects all single-bit errors, and detects all double-bit errors and all errors within a nibble. The memory controller 72 provides thirteen multiplexed address signals which allows memory densities from 256 K up to 16 MB. Eight row address strobe (RAS) signals are provided allowing support up to eight banks of memory. The DRAM banks (20 and 20') may be built from standard memory modules or directly attached memory chips. The data path to the memory banks (20 and 20') must be 64 bits wide (72 bits with parity or ECC). Eight column address strobe (CAS) signals are provided for byte selection. The memory controller 72 drives all CAS signals during ECC mode. In addition to the thirteen row/column multiplexed address signals (MA<0 . . . 12>), the eight RAS signals, and the eight CAS signals, there are 64 data signals (DH<0 . . . 31>) and (DL<0 . . . 31>), a write enable signal (WE), and eight parity/ECC bits (PAR<0 . . . 7>).

Figure 6A:
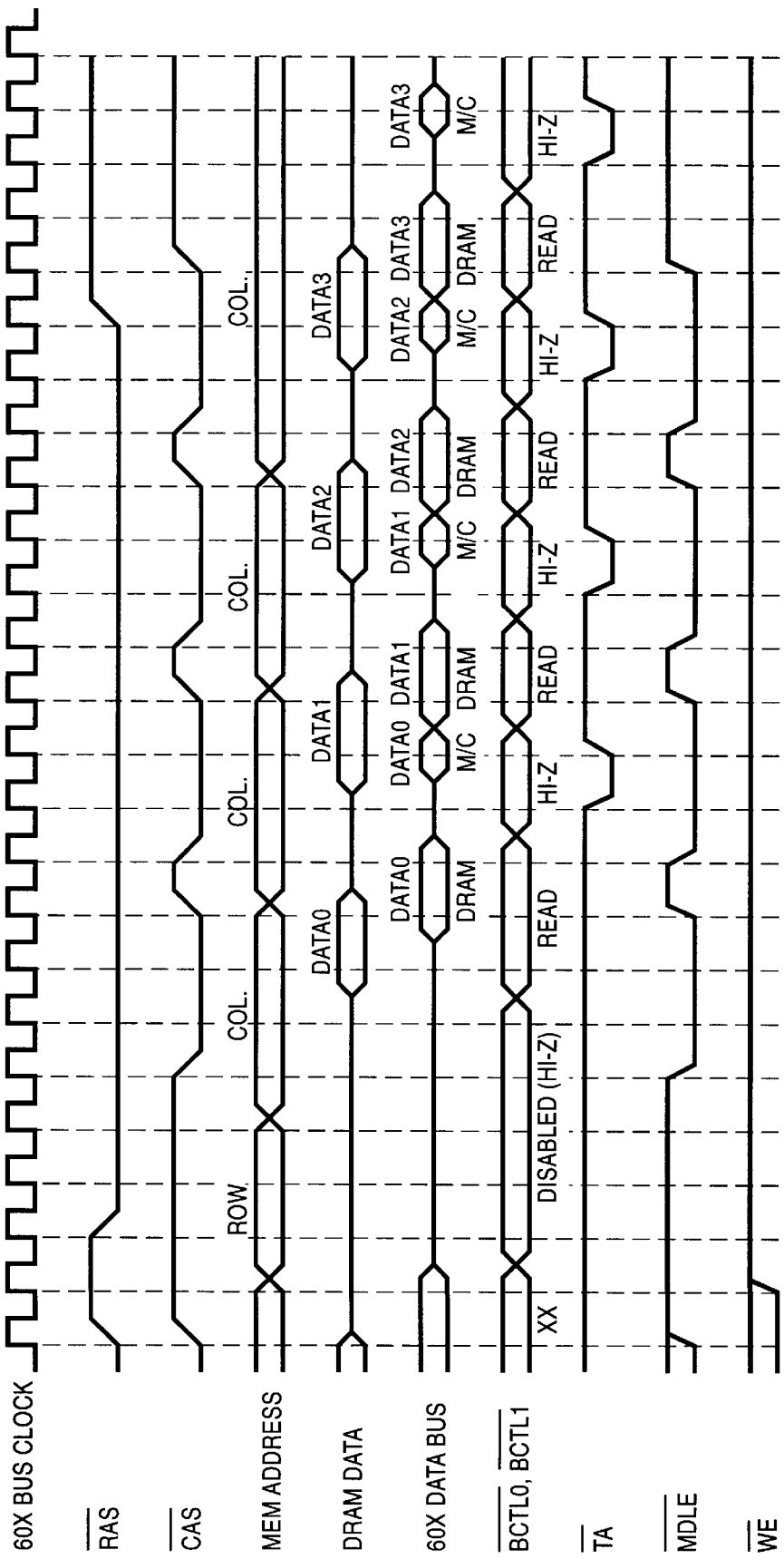
FIGS. 6A and 6B show timing diagrams of memory read operations of the memory controller.

When the memory controller 72 is operated in ECC mode, the memory is read and written using ECC methods well known in the art. ECC operations on an eight-byte DIMMs requires the memory controller to write all eight bytes at the same time along with the generated ECC bits. When performing a one through seven byte write to the DIMM, the memory controller 72 reads the memory module first to get the extra bytes (i.e., since ECC bits are based on all eight bytes of data and ECC modules require all eight bytes to be written at one time) then writes back all eight bytes along with the new ECC bits. Similarly, when memory controller 72 performs any size read, all eight bytes plus the eight ECC bits are read. The ECC bits are checked against the data and if an error is detected, the ECC bits are used to correct the bad data before passing data to the processor. A timing diagram is shown in FIG. 6A for DRAM Read with ECC.

Figure 6B:
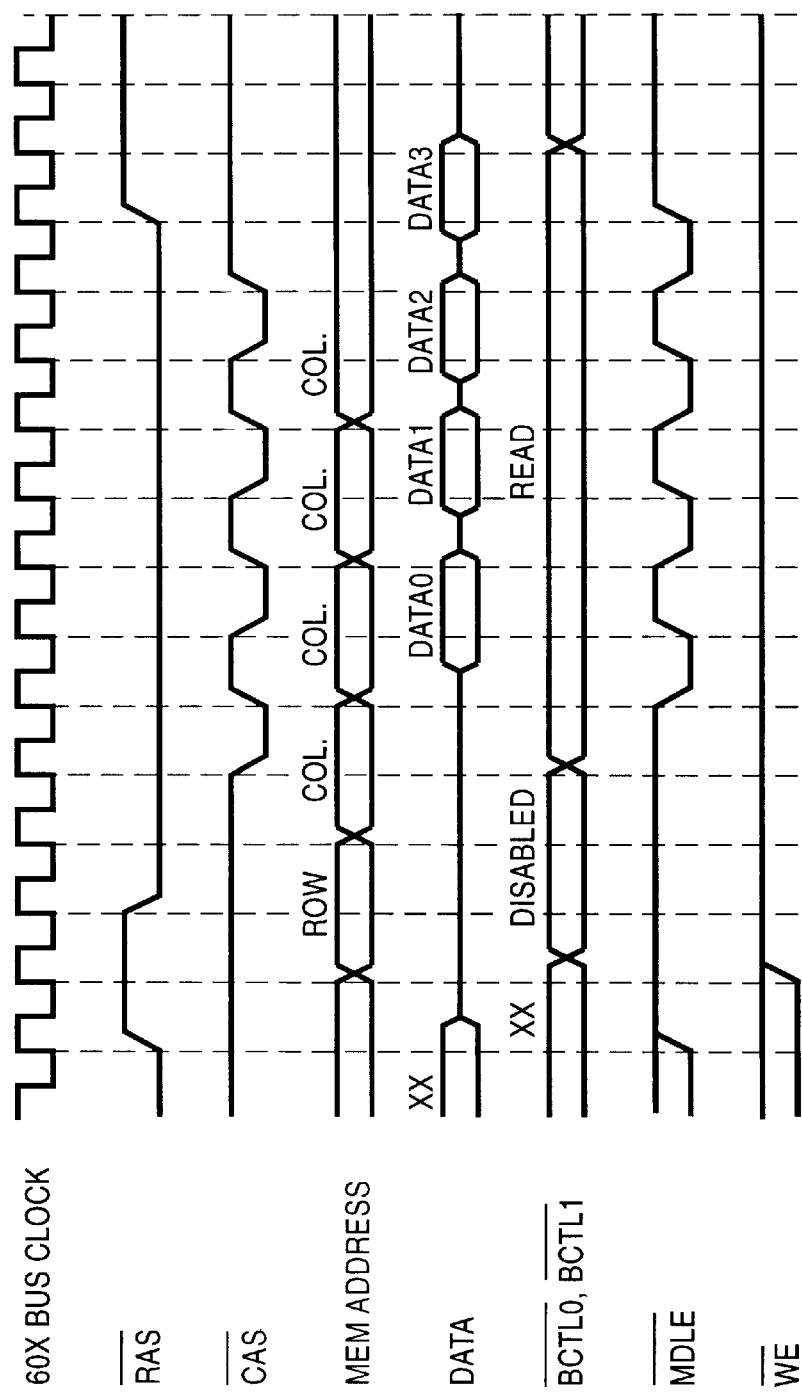

Alternatively, the memory controller 72 may be operated in parity error detection mode in a manner well known in the art. The memory controller 72 writes all eight bytes at the same time along with the generated parity bits when performing eight byte write operations to the DIMM. One through seven byte write operations are performed by reading the memory module first to get the extra bytes, and then writing back all eight bytes along with the new parity bits (i.e., eight byte ECC DIMMs do not allow single bytes to be written thus requiring all eight bytes to be written at once). When the memory controller 72 is operated in parity mode, read operations of any size require all eight bytes plus the eight parity bits. In the preferred embodiment, the required data bytes are immediately given to the processor. At the same time, the parity bits are checked against the data and if an error is detected, an error signal is given to the processor. As appreciated by one skilled in the art, the major difference between operation of the memory controller 72 in ECC and parity mode occurs in read operations. When the memory controller 72 reads data in ECC mode, it is not handed to the processor immediately but is checked first to see if a correction must occur. A timing diagram showing a parity read operation is shown in FIG. 6B.

Figure 4A:
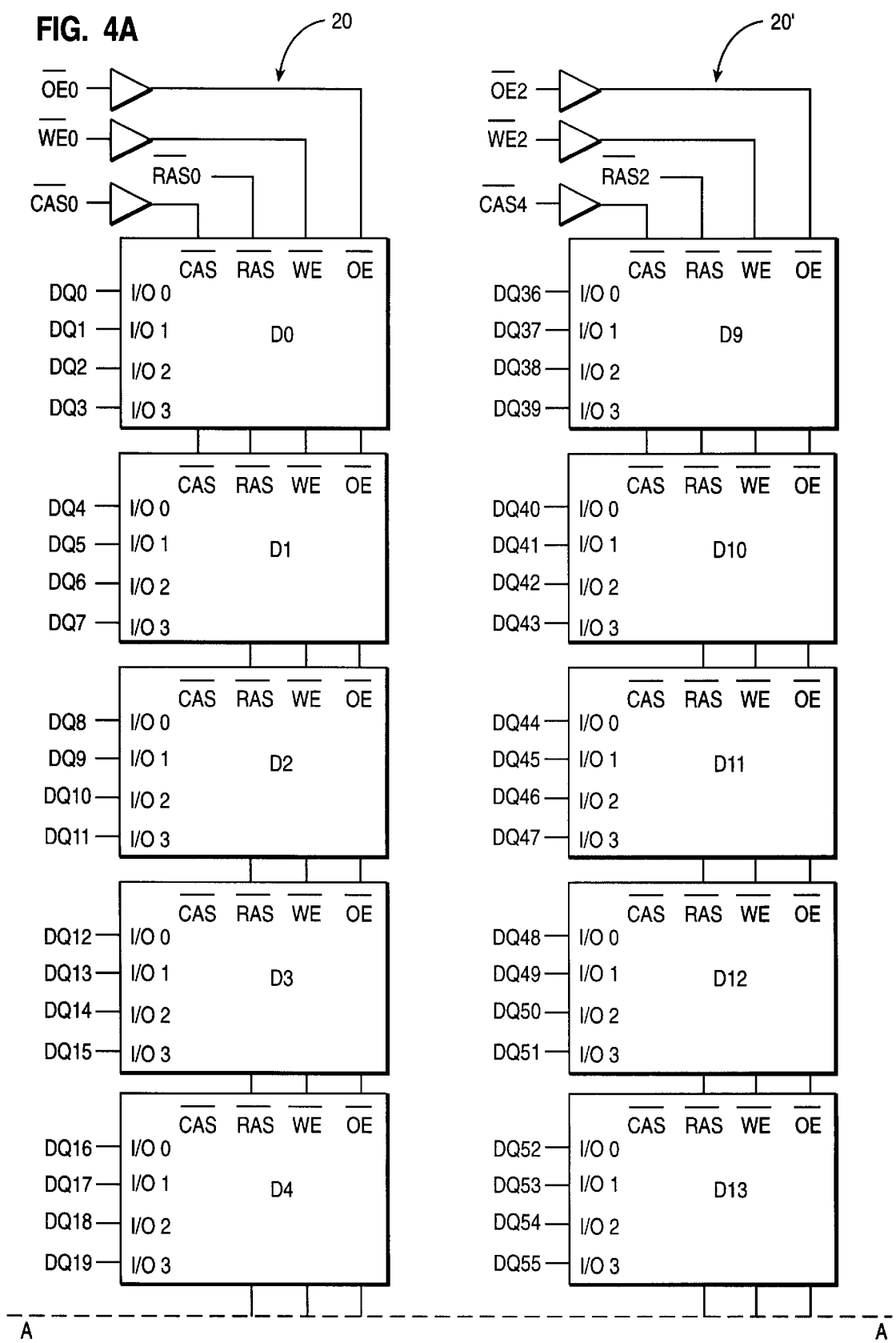
FIG. 4 illustrates a two bank memory configuration utilizing eighteen memory modules.
Figure 4B:
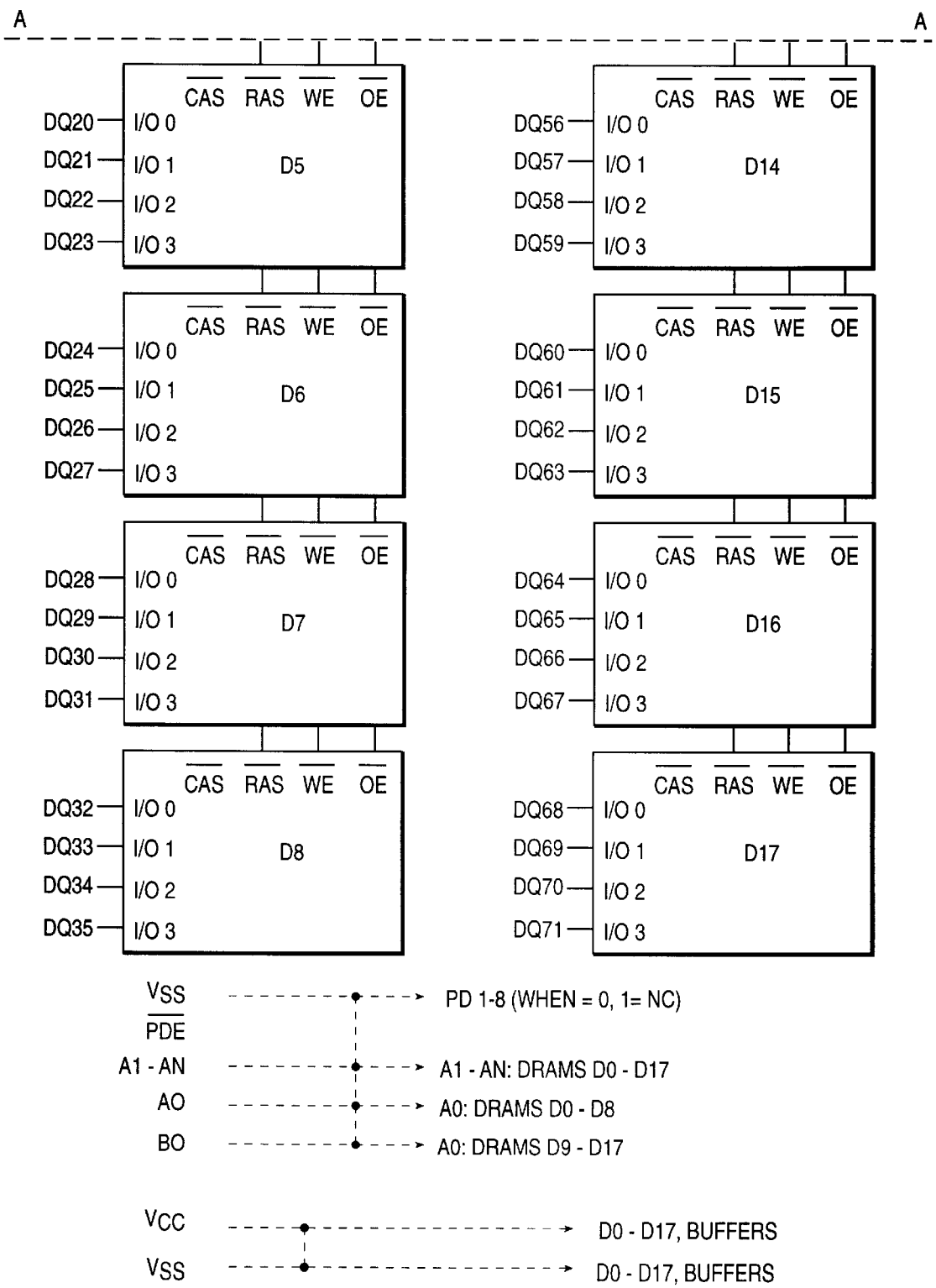
Figure 5:
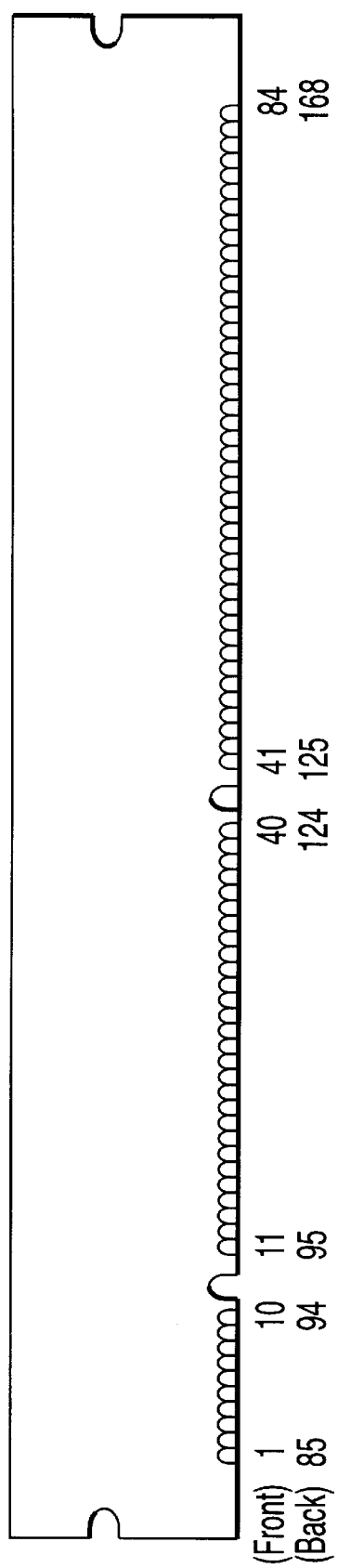
FIG. 5 shows an 168-pin eight-byte Dual in-line Memory Module where the two bank memory configuration of FIG. 4 may be placed.

Referring to FIG. 4, there is shown a block diagram of a two bank layout of a 16M×72-bit DRAM. The two-bank layout contains 18 memory modules arranged in two banks (20 and 20'). In the preferred embodiment, the 18 memory modules are arranged on an industry standard 168-pin 8-byte Dual inline Memory Module as shown in FIG. 5.

Figure 7:
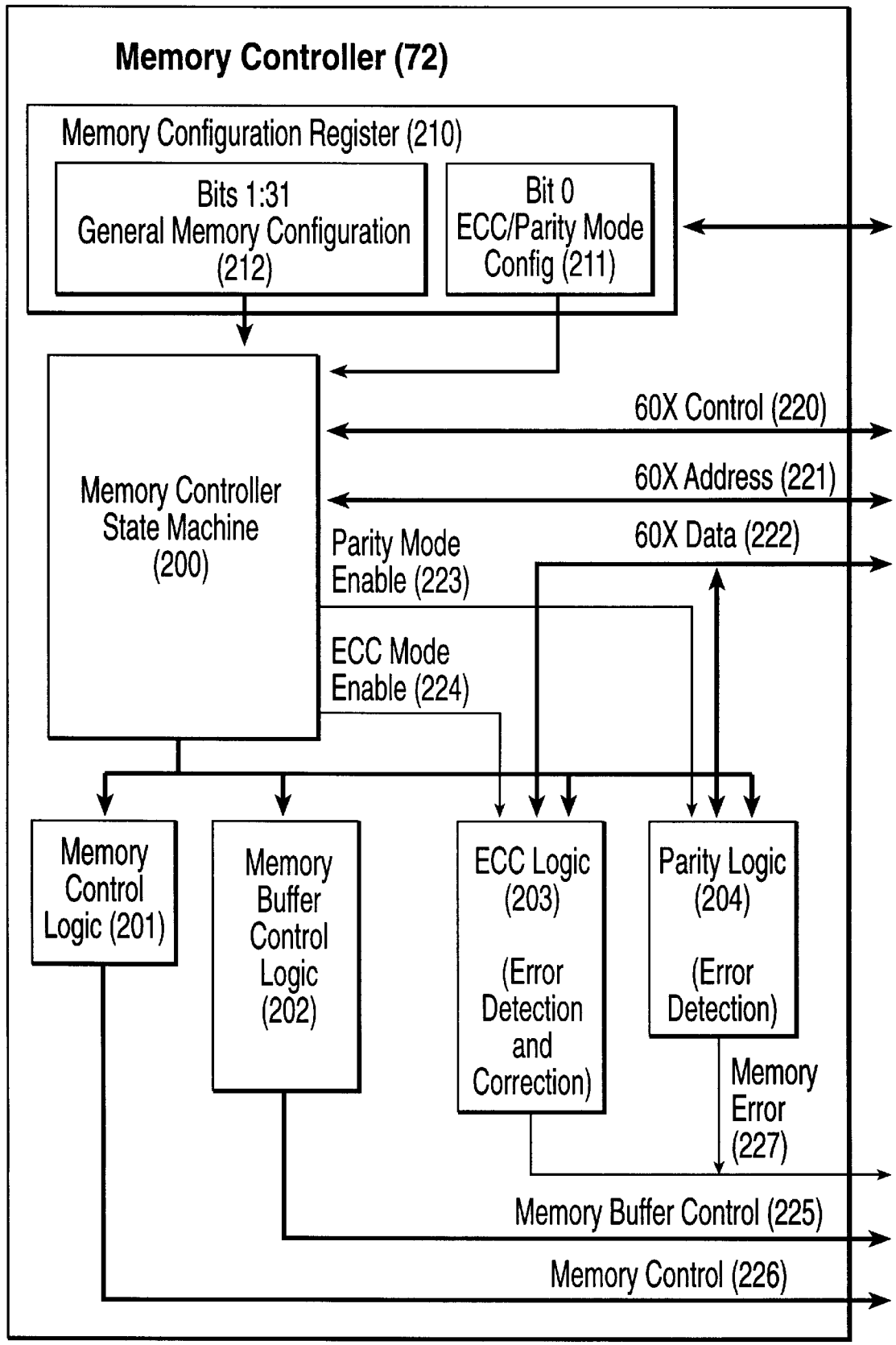
FIG. 7 shows the memory control configuration registers of the memory controller.

Referring now to FIG. 7, there is shown the internal logic of memory controller 72. The bits in a memory configuration register 210 are programmed during system initialization based on the installed memory size and speed and also information previously saved in the system NVRAM. The memory configuration register 210 determines the correct operation of the memory controller 72. Memory configuration register 210 contains bit 0, ECC/Parity Mode Configuration 211 that maintains what mode the memory controller will operate in. Bit 0, ECC/Parity Mode Configuration 211, is programmed to a 1 value to place the memory controller 72 into ECC Mode and to a 0 value to place the memory controller 72 into Parity Mode. The bits in memory configuration register 210 determines the operation of the main memory controller logic in the memory controller state machine 200. The memory controller state machine 200 provides control signals for all of the internal logic blocks including memory control logic 201, memory buffer control logic 202, ECC logic 203 and parity logic 204.

The memory control logic 201 provides all memory address and control signals to the memory 20 to determine which memory location is accessed and whether the location should be read and written. The memory/buffer control logic 202 provides control signals to the memory data latch/buffer 74 to determine the direction of data flow and latch data at the appropriate times. The ECC logic 203 and Parity logic 204 are mutually exclusive.

When the memory controller 72 is in ECC mode, the ECC mode enable 224 is driven active and the ECC logic 203 is used to check data from 60X data 222 and redrive data onto 60X data 222 if a correction is needed. In the case of an uncorrectable memory error, the ECC logic 203 drives memory error 227 active to signal that a fatal error has occurred to the 60X processor 14. In this mode, the parity mode enable 223 is driven inactive so that parity logic 204 is disabled.

When the memory controller 72 is in parity mode, the parity mode enable 223 is driven active and the parity logic 204 is used to check data from 60X data 222. In the case of any memory error, the parity logic 203 drives memory error 227 active to signal that a fatal error has occurred to the 60X processor 14. In this mode, the ECC mode enable 224 is driven inactive so that ECC logic 204 is disabled. The various registers allow the invention to operate in ECC or parity mode. Users are able to change the settings to obtain the desired performance/integrity.

While the invention has been described with respect to a preferred embodiment thereof, it will be understood by those skilled in the art that various changes in detail may be made therein without departing from the spirit, scope, and teaching of the invention. Accordingly, the herein disclosed invention is to be limited only as specified in the following claims.

What we claim is:

1. A method, implemented in a computer system, for providing user selection between ECC memory operation and parity memory operation on the same memory card, comprising the steps of:

providing error checking and correction on data from an eight byte memory module in a memory controller in said computer system;

providing parity checking on said data from said eight byte memory module in said memory controller in said computer system;

enabling user selection between said error checking and correction and said parity checking on said memory controller using a programmable register; and executing said user selection on said data from said eight byte memory module using an eight bit byte connected to said memory module.

2. The method of claim 1 wherein the step of enabling user selection further comprises:

inputting selection data by said user to a configuration register on said memory controller; and detecting said selection data from said configuration register and operating said memory controller for ECC and parity operation.

3. The method of claim 2 wherein the step of inputting selection data further comprises:

storing the configuration register on said memory controller in an NVRAM; and using the stored configuration register in said NVRAM to enable the memory controller for ECC or parity operation during initial program load of said computer system.

4. The method of claim 1 wherein the step of enabling user selection further comprises:

detecting an ECC operation during a read of said data from said eight byte memory module; and reading said eight bit byte and correcting an error in said data from said eight byte memory module.

5. The method of claim 1, wherein the step of enabling user selection further comprises:

detecting a parity operation during a read of said data from said eight byte memory module; and inputting said data from said eight byte memory module to a processor in said computer system.

6. An apparatus for providing user selection between ECC memory operation and parity memory operation on the same memory card, comprising:

means for generating error checking and correction on data from an eight byte memory module in a memory controller in a computer system;

means for generating parity checking on said data from said eight byte memory module in said memory controller in said computer system;

means for providing user selection between said means for error checking and correction and means for parity checking using a programmable resister; and means responsive to said means for providing user selection for performing the user selected memory operation using an eight bit byte on said data from said eight byte memory module.

7. The apparatus of claim 6 wherein said means for providing user selection further comprises:

means for inputting data by a user to a memory configuration register; and means for detecting said memory configuration register and operating said memory controller for ECC and parity.

8. The apparatus of claim 7 wherein said means for inputting selection data further comprises:

means for storing the configuration register on said memory controller in an NVRAM; and means for using the stored configuration register in said NVRAM to setup the memory controller for ECC or parity operation.

9. The apparatus of claim 6, wherein the means for providing user selection further comprises:

means for detecting an ECC operation during a read of said data from said eight byte memory module;

means for reading said eight bit byte and correcting an error in said data from said eight byte memory module.

10. The apparatus of claim 6 wherein the means for providing user selection further comprises:

means for detecting a parity operation during a read of said data from said eight byte memory module;

means for inputting said data from said eight byte memory module to a processor in said computer system.

* * * * *